(12) United States Patent
Takahashi et al.

(10) Patent No.: US 6,387,760 B2
(45) Date of Patent: May 14, 2002

(54) METHOD FOR MAKING SEMICONDUCTOR DEVICE HAVING BENT GATE ELECTRODE

(75) Inventors: Toshifumi Takahashi; Keita Kumamoto, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/828,873

(22) Filed: Apr. 10, 2001

Related U.S. Application Data (62) Division of application No. 09/307,748, filed on May 10, 1999, now Pat. No. 6,246,080.

(30) Foreign Application Priority Data

May 14, 1998 (JP) .............................................. 11-132310

(51) Int. Cl.$^7$ ............................................. H01L 21/336
(52) U.S. Cl. ........................ 438/284; 438/286; 438/585; 438/587; 438/588
(58) Field of Search ................................ 438/284, 286, 438/585, 587, 588

(56) References Cited

U.S. PATENT DOCUMENTS 5,490,095 A    2/1996   Shimada et al.

FOREIGN PATENT DOCUMENTS

| JP | 62-244148 | 10/1987 |
| JP | 1-235275 | 9/1989 |
| JP | 2-170437 | 7/1990 |
| JP | 2-250332 | 10/1990 |
| JP | 3-257861 | 11/1991 |
| JP | 4-164371 | 6/1992 |
| JP | 5-136407 | 6/1993 |

Primary Examiner—Long Pham
(74) Attorney, Agent, or Firm—Sughrue Mion, PLLC (57) ABSTRACT

A semiconductor device comprising, on a semiconductor substrate, an element-isolating region, an active region, and a gate electrode with a bent portion having a bent-angle θ on the active region. The boundary between the element-isolating region and the active region intersects the gate electrode so that the line segments of the boundary at which said intersection takes place, are approximately parallel to the bisector of the bent-angle θ of the bent portion of the gate electrode. In this semiconductor device, the variation in width of gate electrode is small and accordingly the variation in properties is small, even when the relative position of gate electrode and active region of MOSFET has shifted slightly.

4 Claims, 11 Drawing Sheets

METHOD FOR MAKING SEMICONDUCTOR DEVICE HAVING BENT GATE ELECTRODE

This is a divisional of application Ser. No. 09/307,748 (Confirmation Number not yet assigned) filed May 10, 1999, now U.S. Pat. No. 6,246,080 the disclosure of which is incorporated herein by reference.

BACKGROUND OF THE INVENTION

1. Field of the Invention

The present invention relates to a semiconductor device with a bent gate, particularly a semiconductor device having a MOSFET with a bent gate.

2. Description of the Prior Art

Figure 12:
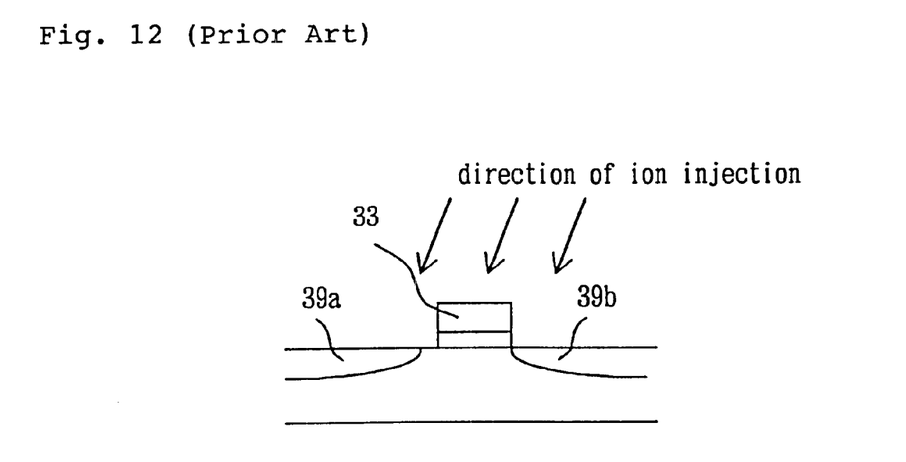
FIG. 12 is a view showing that ion-injected regions are formed asymmetrically when ion injection is made obliquely.

MOSFETs having a bent gate have been used to meet the requirements of the production, properties and layout. As shown in FIG. 12, when ion injection is made slightly obliquely using a gate electrode 33 as a mask, to form impurity-injected regions 39a and 39b in an active region, a non-injected region remains between the gate electrode 33 and the impurity-injected region 39a and, as a result, asymmetry appears between the region 39a and the region 39b. Hence, it is disclosed in JP-A-2-250332 that when a gate electrode 33 is formed on an active region 34 in a shape bent by 90° as shown in FIG. 13, shade does not appear in all of the vicinity of the gate electrode 33 even when ion injection is made slightly obliquely, and improved symmetry is obtained.

A large gate width results in a decreased resistance of channel region and accordingly in an increased transfer speed of signal. Hence, the use of a bent gate makes it possible to have a large gate width in a narrow region, which widen the degree of freedom in the layout of MOSFET.

Figure 14:
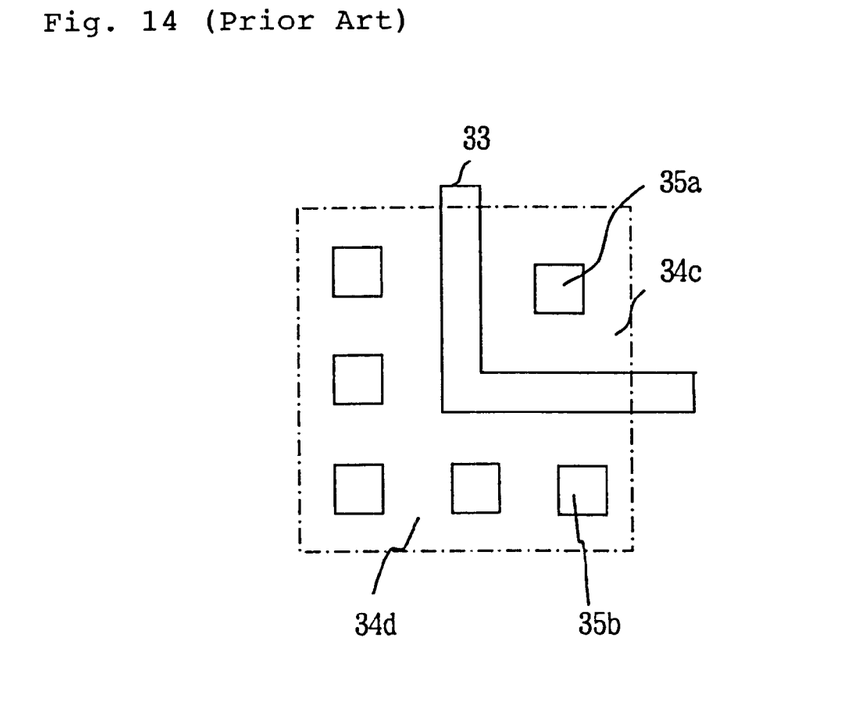
FIG. 14 is a view showing a conventional positional relationship between bent gate electrode, contacts and active regions.

As shown in FIG. 14, with a bent gate, the gate width is relatively large and yet a small distance between a contact and gate electrode can be secured, whereby a decreased parasitic resistance can be obtained. That is, several contacts (indicated by contacts 35b in FIG. 14) are formed for decreased parasitic resistance; however, by using a bent gate, a decreased parasitic resistance can be obtained by using one contact 35a in an active region 34c which is inside of the bent portion of bent gate. Further in FIG. 14, the area of the active region 34c is ⅓ of that of an active region 34d (which is outside of the bent portion of bent gate); therefore, the parasitic capacitance of the active region 34c to the semiconductor substrate can be reduced to ⅓ of that of the active region 34d.

Figure 13:
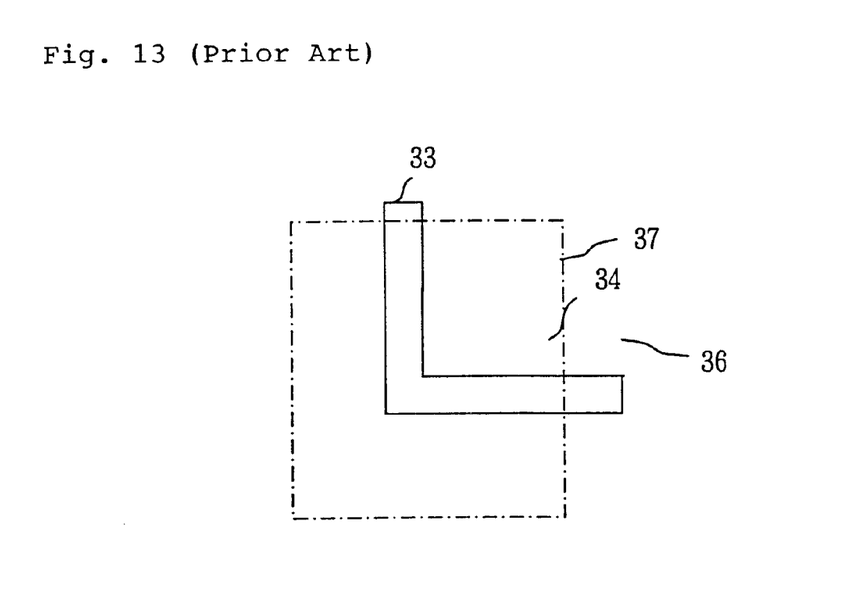
FIG. 13 is a view showing a conventional positional relationship between bent gate electrode and active region.

The positional relationship between bent gate and active region has been such that the boundary 37 of the active region 34 and the element-isolating region 36 intersects the gate electrode 33 at right angles, as shown in FIG. 13.

Figure 15:
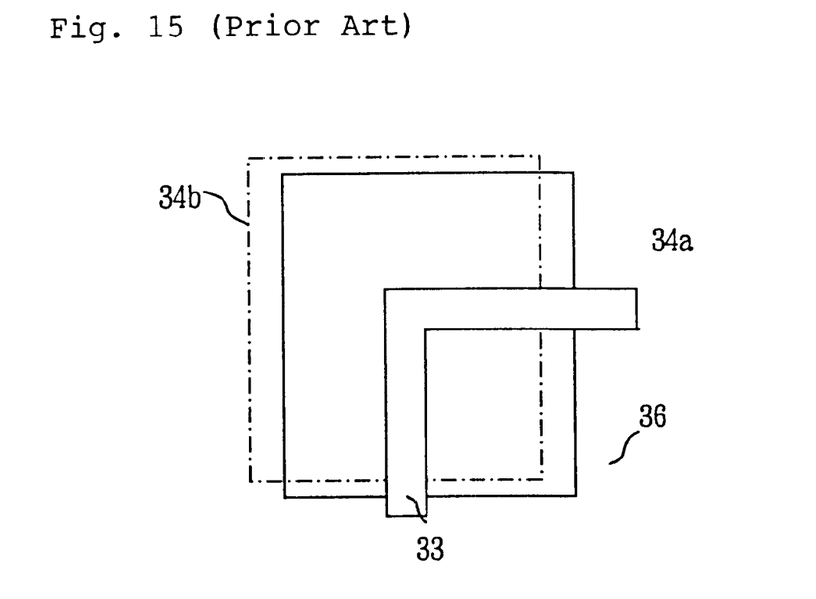
FIG. 15 is a view showing a conventional positional relationship between bent gate electrode and active region both when there is no misalignment and when there is misalignment.

In such a positional relationship between bent gate and active region, however, when mask misalignment takes place in formation of element-isolating region 36 and resultant determination of active region or in formation of gate electrode 33, the relative position of gate electrode 33 and active region shifts as shown in FIG. 15 by an active region 34a (when there is no misalignment) and an active region 34b (when there is misalignment); as a result, the formed width of channel becomes different from the width of layout and no intended transistor properties are obtainable.

Figure 16:
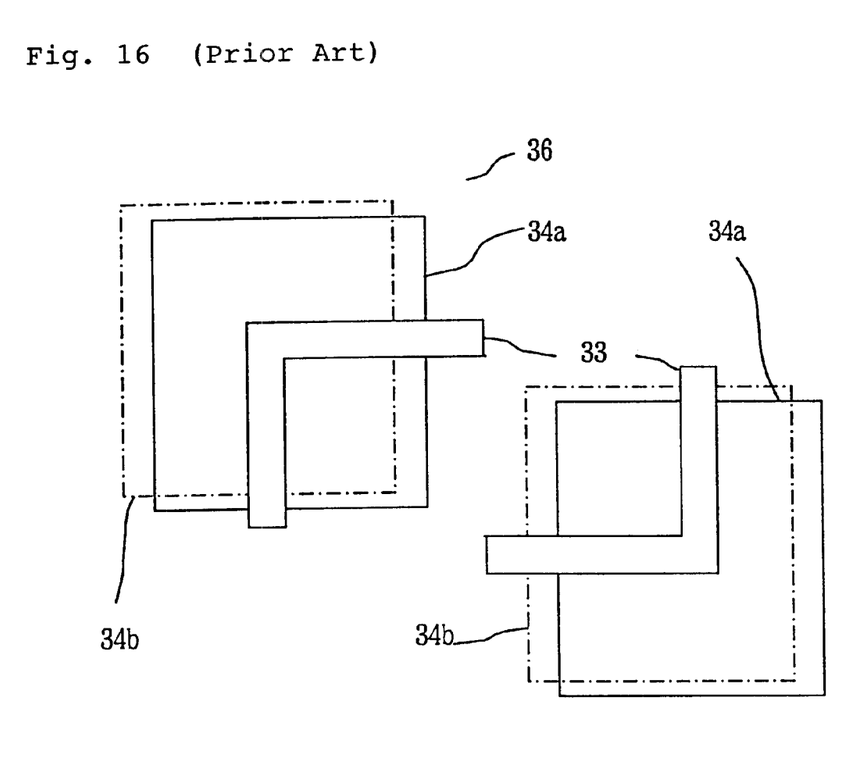
FIG. 16 is a view showing a positional relationship between bent gate electrode and active region when two bent gate electrodes have been arranged symmetrically in a conventional semiconductor device.

As shown in FIG. 16, when two MOSFETs each having a bent gate are formed symmetrically for the layout requirement and when misalignment takes place, the width of gate decreases in the left MOSFET and conversely increases in the right MOSFET. The balance in transistor properties are adversely lost.

SUMMARY OF THE INVENTION

The present invention has been completed in order to solve the above-mentioned problems of the prior art. The present invention has an object of providing a semiconductor device in which the variation in gate width is small and accordingly the variation in properties is small even when the relative position of gate electrode and active region of MOSFET has shifted.

The present invention is directed to a semiconductor device comprising, on a semiconductor substrate, an element-isolating region, an active region, and a gate electrode with a bent portion having a bent-angle θ on the active region, wherein the boundary between the element-isolating region and the active region intersects the gate electrode so that the line segments of the boundary at which said intersection takes place, are approximately parallel to the bisector of the bent-angle θ of the bent portion of the gate electrode.

The present invention is also directed to a process for producing a semiconductor device comprising, on a semiconductor substrate, an element-insulating region, an active region, and a gate electrode with a bent portion having an angle θ on the active region, wherein the process comprises the steps of:

forming, on a predetermined region of the semiconductor substrate, a mask having such a shape that the circumference of the mask intersects the gate electrode to be formed in a later step and that the line segments of the mask circumference at which the intersection takes place, are approximately parallel to the bisector of the bent-angle θ of the bent portion of the gate electrode;

forming, on the area of the semiconductor substrate not covered with the mask, the element-isolating region and thereby determining the active region;

removing the mask and then forming the gate electrode having a bent portion; and conducting ion injection using the gate electrode as a mask to form impurity-injected regions in the active region.

In these views, 1 is a silicon substrate; 2 is a mask; 3 is a gate electrode; 4 is an active region; 4a is an active region when there is no misalignment; 4b is an active region when there is misalignment; 5 is an inter-layer insulating film; 6 is an element-isolating region; 7 is a boundary; 8 is a line segment; 9 is an impurity-injected region; 10 is a bisector; 11 is a wiring; and 12 is a contact.

DETAILED DESCRIPTION OF THE INVENTION

Figure 1:
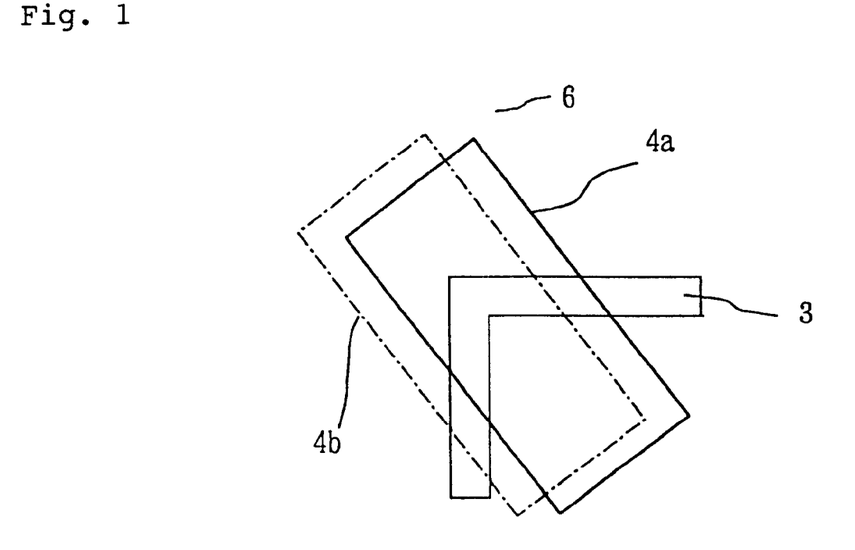
FIG. 1 shows a positional relationship of the element-isolating region, active region and gate electrode in the present semiconductor device.
Figure 2:
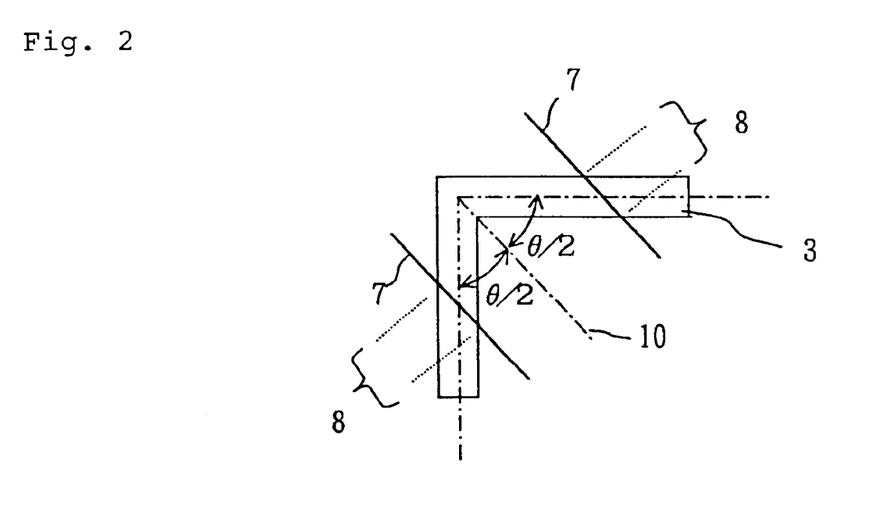
FIG. 2 shows a positional relationship of the gate electrode and boundary of element-isolating region and active region in the present semiconductor device.

FIG. 1 is a plan view showing a positional relationship of the element-isolating region, active region and gate electrode in the present semiconductor device. As shown in FIG. 1, the gate electrode 3 is formed so as to stretches over the active region (4a or 4b) and the element-isolating region 6. when viewed two-dimensionally, the boundary of the active region and the element-isolating region intersects the gate electrode. As shown in FIG. 2, the line segments 8 of the boundary 7 at which said intersection takes place, are approximately parallel to the bisector 10 of the bent-angle θ of bending of the gate electrode 3.

In the above positional relationship, as shown in FIG. 1, the width of gate electrode in the active region (in the plan view) makes no change or makes very minor change even if, in formation of element-isolating region, the position of active region has shifted from the layout position (active region 4a) to a different position (active region 4b) and the relative position of active region and gate electrode has changed.

Figure 3:
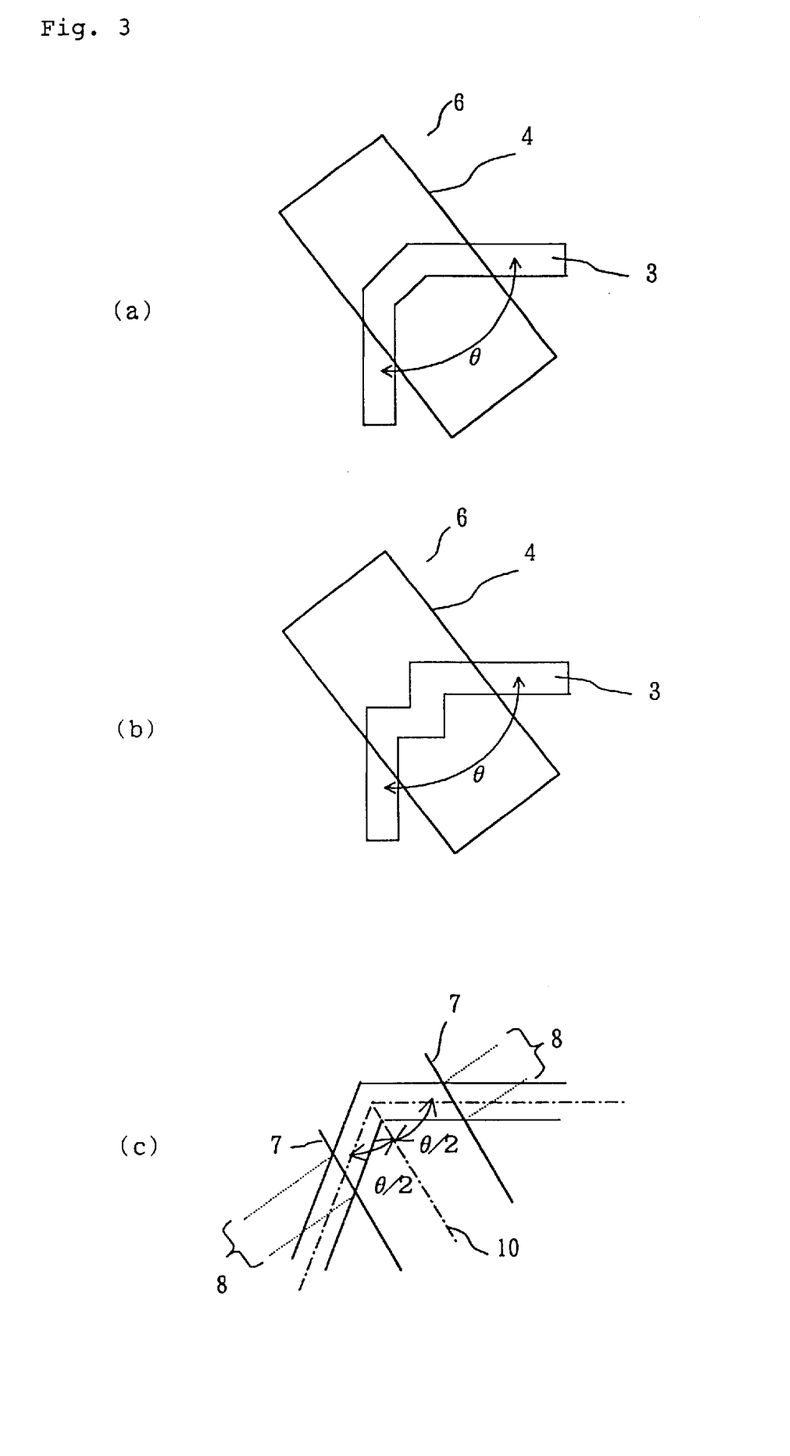
FIGS. 3a, 3b, 3c and shows a positional relationship of the element-isolating region, active region, boundary thereof and gate electrode in the present semiconductor device.

In the present invention, the gate electrode may have one bent portion or two or more bent portions as shown in FIG. 3(a) and FIG. 3(b). In these cases, the bent-angle θ of bending of gate electrode is an angle formed by the two electrode portions each intersecting the boundary of active region and element-isolating region, as shown in FIG. 3(a) and FIG. 3(b). Incidentally, the gate electrode may have a bent portion(s) outside of the active region as necessary; however, such bent portion(s) has (have) nothing to do with the bent portion(s) associated with the present invention.

The present invention exhibits the largest effect when the bent-angle θ of bending of gate electrode is 90°. The effect of the present invention is applicable also when the bent-angle θ is an obtuse angle as shown in FIG. 3(c); in this case, the line segments 8 of the boundary 7, formed by intersection of the boundary 7 and the gate electrode are allowed to be approximately parallel to the bisector of the bent-angle θ. The same applies also when the bent-angle θ is an acute angle.

The bisector 10 and the line segments 8 are formed so as to become as parallel as possible. For example, the angle formed by the bisector 10 and the line segments 8 is acceptable for ordinary purposes if it is within ±10°; but is preferably within ±5°.

The shape of the active region is not necessarily rectangular as shown in FIG. 1. The shape may be other than that as long as the boundary of active region and element-isolating region has a required angle (approximately parallel) to the bisector of the bent-angle θ of bending of gate electrode even when the shifting of active region takes place. In such a shape, the above-mentioned line segments of the boundary can always have a required angle (approximately parallel) to the bisector of the bent-angle θ of bending of gate electrode.

Embodiment

Figure 4:
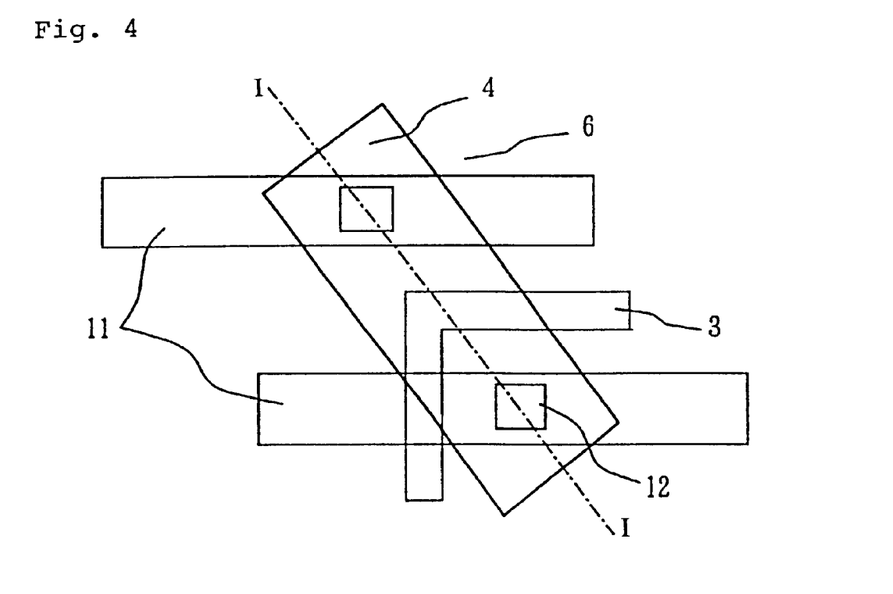
FIG. 4 is a plan view showing a semiconductor device of the present invention.

The present invention is described in more detail below by way of Embodiment. Description is made on a semiconductor device with a gate electrode having a bent-angle θ of 90°, such as shown in FIG. 4 (plan view), by explaining its production process with reference to the sectional views taken along the line A–A' of FIG. 4.

Figure 5:
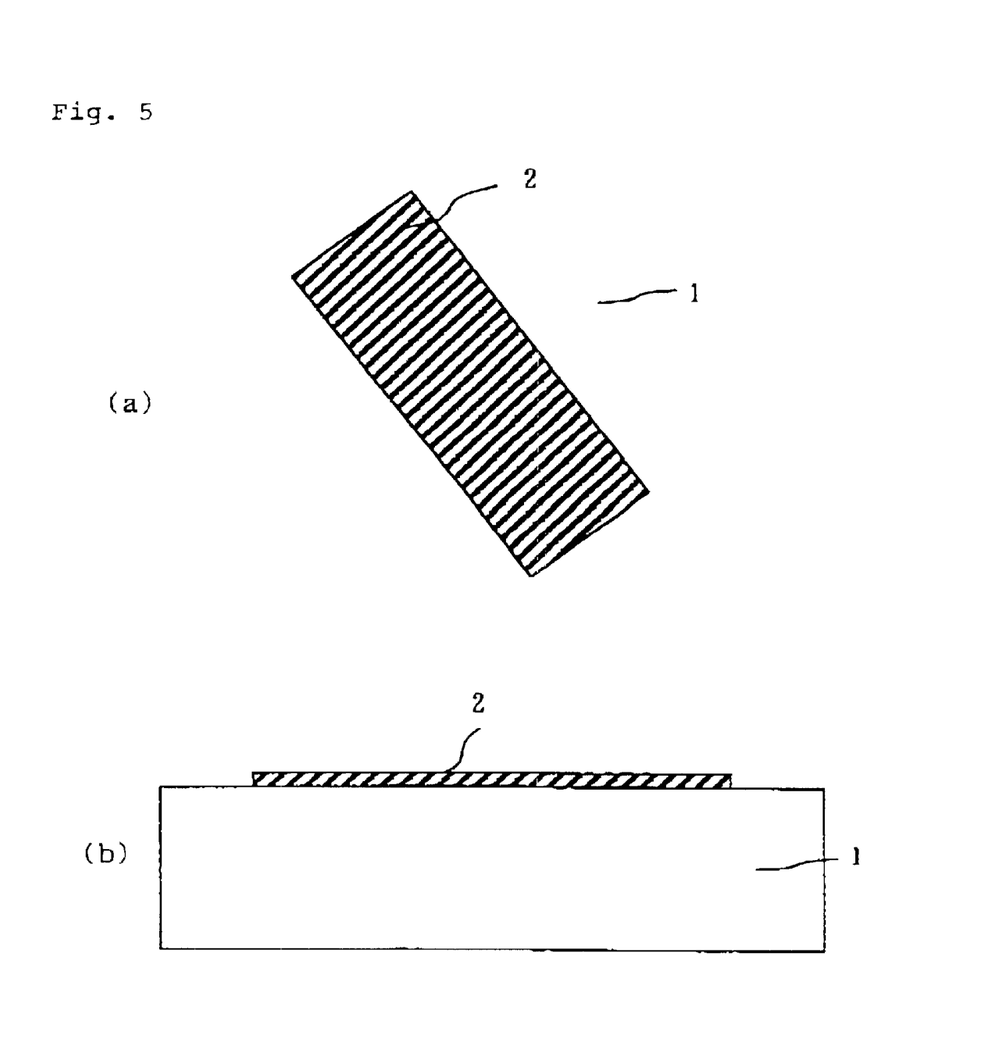
FIG. 5 is views [(a): plan view, (b): sectional view] showing a production step of the present semiconductor device.
Figure 6:
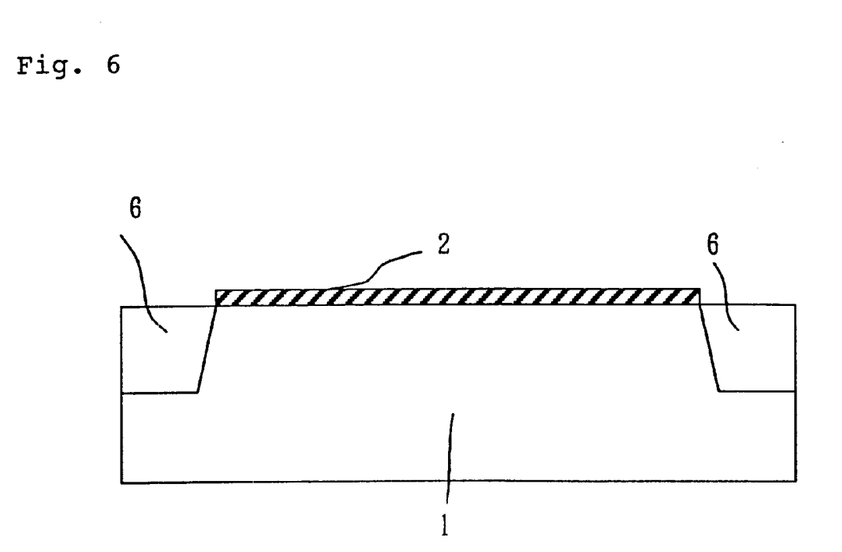
FIG. 6 is a sectional view showing a production step of the present semiconductor device.

As shown in FIG. 5 [(a): plan view, (b): sectional view]], a predetermined region of a silicon substrate 1 is covered with a mask 2 made of, for example, a silicon nitride film. Then, as shown in FIG. 6 (sectional view), the surface of the silicon substrate is subjected to local oxidation to form a LOCOS oxide film, i.e. an element-isolating region 6. The mask is for determination of active region and, in the present Embodiment, the long side of the rectangular mask is allowed to become approximately parallel to the bisector of bent-angle θ of a gate electrode having a bent portion, to be formed later.

Figure 7:
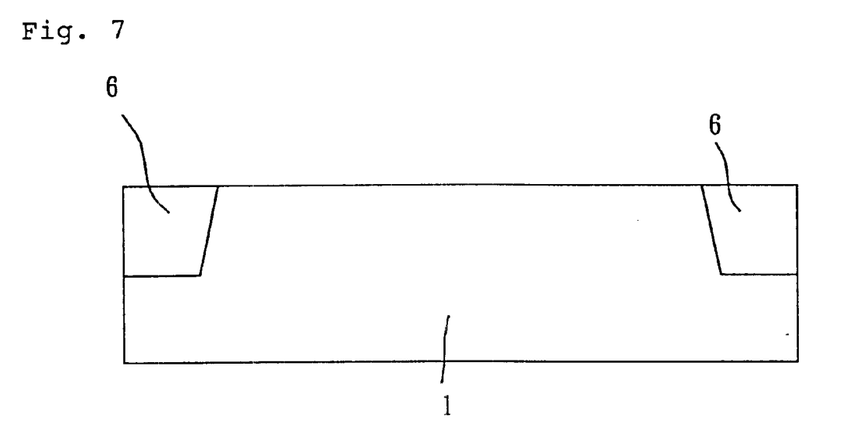
FIG. 7 is a sectional view showing a production step of the present semiconductor device.
Figure 8:
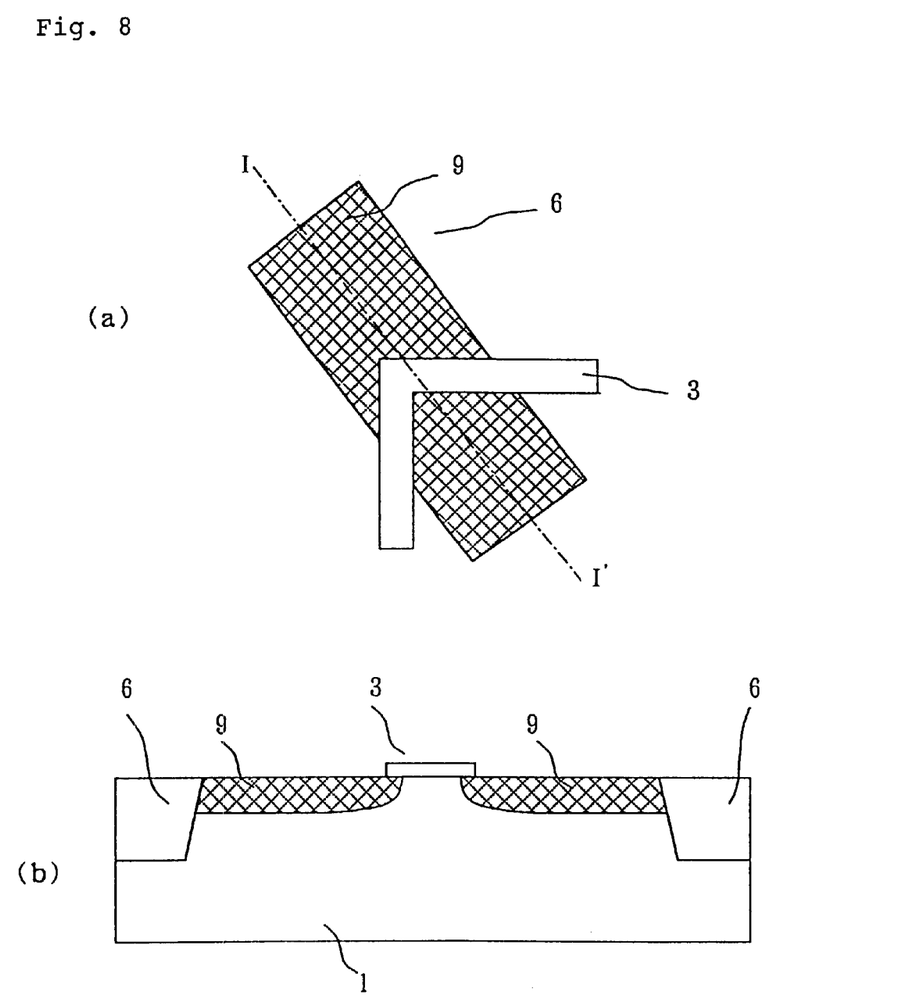
FIG. 8 is views [(a): plan view, (b): sectional view] showing a production step of the present semiconductor device.

The mask 2 is removed (FIG. 7). Then, the surface of the resulting substrate is subjected to heat oxidation. A substance such as polysilicon or the like is deposited thereon and subjected to patterning in a shape having a bent portion to form a gate electrode 3. Ion injection is conducted by using the gate electrode 3 as a mask to form impurity-injected regions 9 in the active region, as shown in FIG. 8 [(a): plan view, (b): sectional view]. In the present invention, the width of gate electrode on active region remains unchanged even when the relative position of the mask pattern for formation of gate electrode and the mask pattern for formation of element-isolating region has shifted; therefore, there is no change of gate width.

Figure 9:
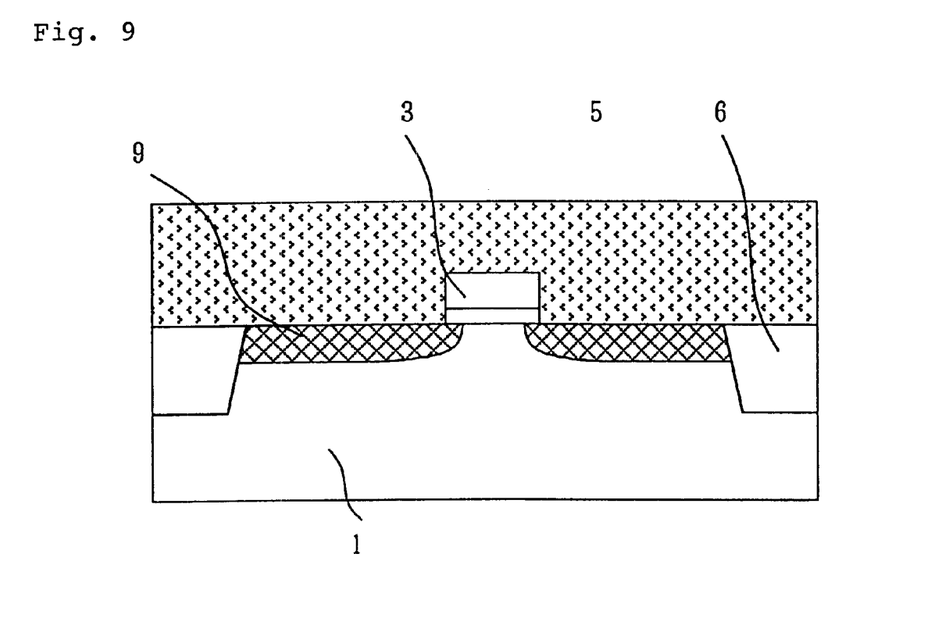
FIG. 9 is a sectional view showing a production step of the present semiconductor device.
Figure 10:
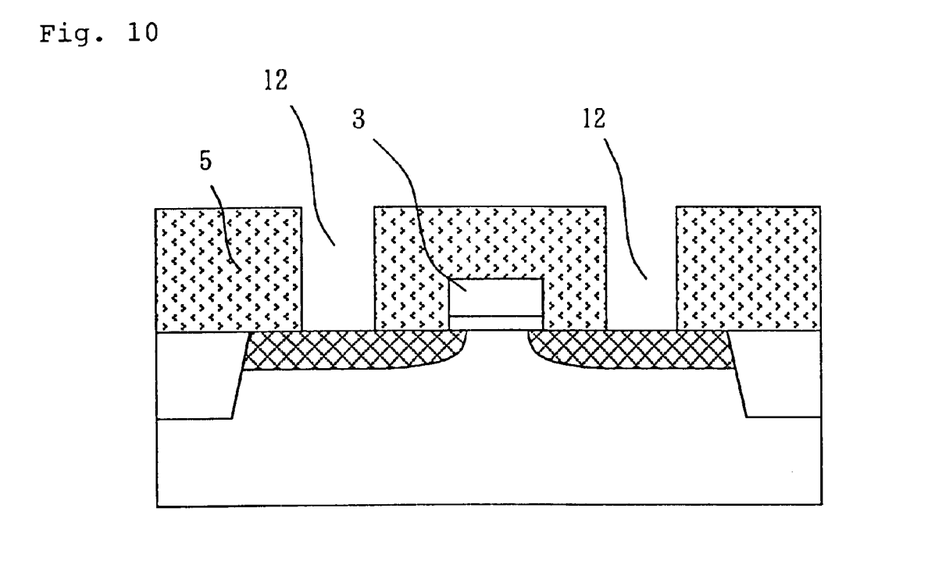
FIG. 10 is a sectional view showing a production step of the present semiconductor device.
Figure 11:
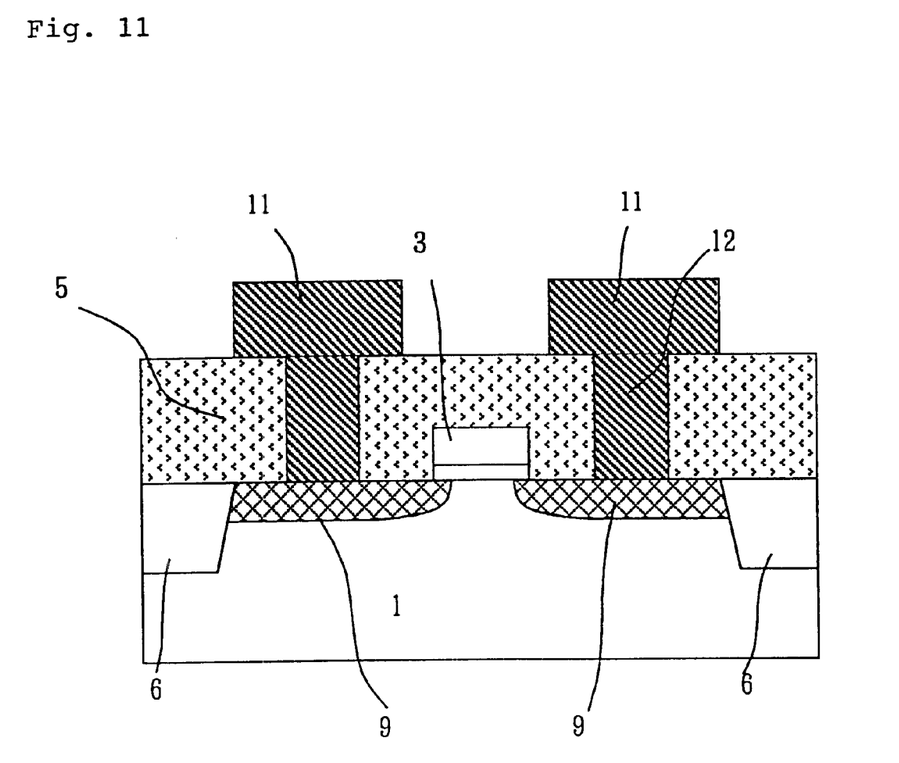
FIG. 11 is a sectional view showing a production step of the present semiconductor device.

Next, as shown in FIG. 9, an inter-layer insulating film 5 is formed. Then, as shown in FIG. 10, contacts 12 are formed in the inter-layer insulating film 5. Thereafter, a metal film is formed and subjected to patterning to form wirings 11, as shown in FIG. 11, whereby a semiconductor device is completed.

According to the present invention, there can be provided a semiconductor device which is small in parasitic resistance and parasitic capacitance, of source or drain and which is small in variation of gate width and accordingly in variation of properties even when the relative position of gate electrode and active region of MOSFET has shifted; and a process for production of such a semiconductor device.

What is claimed is:

1. A process for producing a semiconductor device comprising, on a semiconductor substrate, an element-insulating region, an active region, and a gate electrode with a bent portion having a bent-angle θ on the active region, wherein the process comprises the steps of:

forming, on a predetermined region of the semiconductor substrate, a mask having such a shape that the circumference of the mask intersects the gate electrode to be formed in a later step and that the line segments of the mask circumference at which the intersection takes place, are approximately parallel to the bisector of the bent-angle $\theta$ of the bent portion of the gate electrode;

forming, on the area of the semiconductor substrate not covered with the mask, the element-isolating region and thereby determining the active region;

removing the mask and then forming the gate electrode having a bent portion; and conducting ion injection using the gate electrode as a mask to form impurity-injected regions in the active region.

2. A process according to claim 1, wherein the bent-angle $\theta$ of the bent portion is 90°.

3. A process according to claim 1, wherein the angle formed by the line segments and the bisector is within ±10°.

4. A process according to claim 2, wherein the angle formed by the line segments and the bisector is within ±10°.

* * * * *

UNITED STATES PATENT AND TRADEMARK OFFICE
CERTIFICATE OF CORRECTION

PATENT NO. : 6,387,760 B2  
DATED : May 14, 2002  
INVENTOR(S) : Toshifumi Takahasi and Keita Kumamoto It is certified that error appears in the above-identified patent and that said Letters Patent is hereby corrected as shown below:

Title page,  
Item [30], please delete Priority Data "11-132310" insert -- 10-132310 --

Signed and Sealed this

Fourteenth Day of January, 2003

JAMES E. ROGAN  
*Director of the United States Patent and Trademark Office*